United States Patent
Bravo et al.

(10) Patent No.: US 10,622,189 B2
(45) Date of Patent: Apr. 14, 2020

(54) ADJUSTABLE SIDE GAS PLENUM FOR EDGE RATE CONTROL IN A DOWNSTREAM REACTOR

(71) Applicant: Lam Research Corporation, Fremont, CA (US)

(72) Inventors: Andrew Stratton Bravo, Oakland, CA (US); Joydeep Guha, Danville, CA (US); Jatinder Kumar, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 494 days.

(21) Appl. No.: 15/151,650

(22) Filed: May 11, 2016

(65) Prior Publication Data

US 2017/0330728 A1 Nov. 16, 2017

(51) Int. Cl.
| | |
|---|---|
| *C23C 16/40* | (2006.01) |
| *H01J 37/32* | (2006.01) |
| *C23C 16/455* | (2006.01) |
| *C23C 16/50* | (2006.01) |

(52) U.S. Cl.
CPC .. *H01J 37/32082* (2013.01); *C23C 16/45544* (2013.01); *C23C 16/50* (2013.01); *H01J 37/321* (2013.01); *H01J 37/3244* (2013.01); *H01J 37/32449* (2013.01); *H01J 2237/334* (2013.01)

(58) Field of Classification Search
CPC ........... H01J 37/32082; H01J 37/32449; H01J 2237/334; C23C 16/50; C23C 16/45544
USPC ......................... 118/715; 156/345.33, 345.34
See application file for complete search history.

(56) References Cited

U.S. PATENT DOCUMENTS

| | | | | |
|---|---|---|---|---|
| 5,792,269 A | * | 8/1998 | Deacon | ............. C23C 16/45565 118/715 |
| 2010/0119727 A1 | * | 5/2010 | Takagi | ............. C23C 16/45521 427/532 |
| 2011/0256729 A1 | * | 10/2011 | Goodlin | ............ C23C 16/45565 438/758 |

OTHER PUBLICATIONS

U.S. Appl. No. 62/275,837, filed Jan. 7, 2016, Treadwell et al.
U.S. Appl. No. 14/945,680, filed Nov. 19, 2015, Drewery et al.

* cited by examiner

*Primary Examiner* — Rudy Zervigon

(57) ABSTRACT

A side tuning ring for a gas distribution device of a substrate processing system includes a first ring adjacent to a faceplate of the gas distribution device. The first ring surrounds the faceplate and defines a first plenum, communicates with a first gas source, and includes a first plurality of holes arranged to direct gas from the first gas source into a process chamber at a first angle. A second ring is adjacent to the first ring. The second ring surrounds the first ring and defines a second plenum, communicates with at least one of the first gas source and a second gas source, and includes a second plurality of holes arranged to direct gas from the at least one of the first gas source and the second gas source into the process chamber at the first angle or a second angle. The first ring and the second ring are detachable from the faceplate of the gas distribution device.

7 Claims, 5 Drawing Sheets

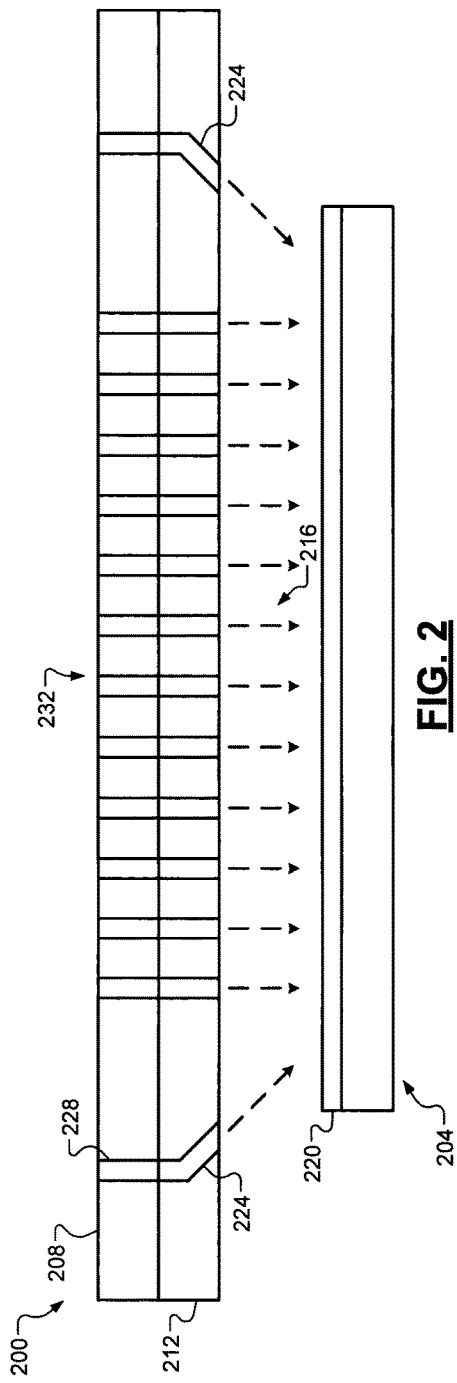
FIG. 2
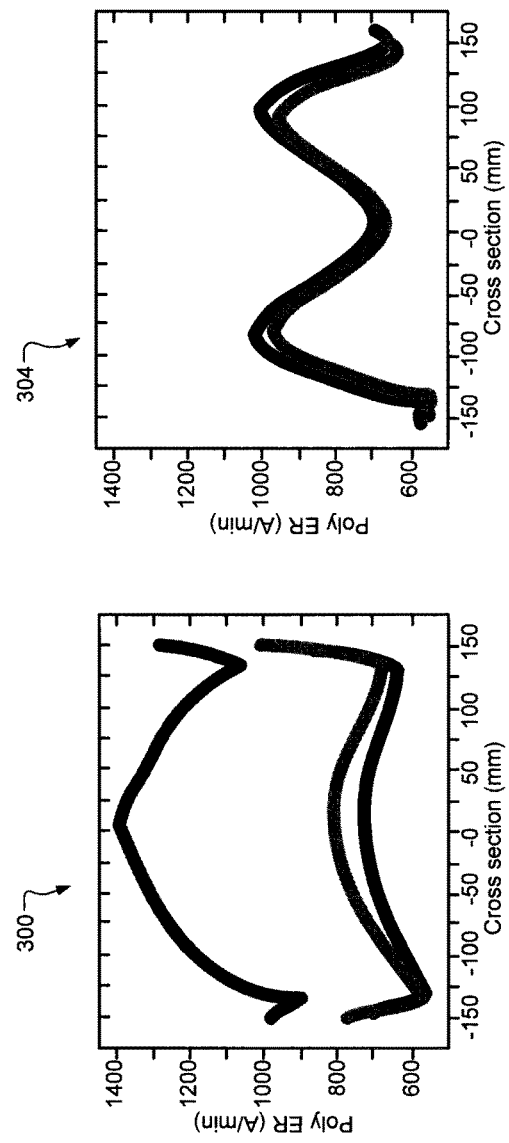
FIG. 3A
FIG. 3B

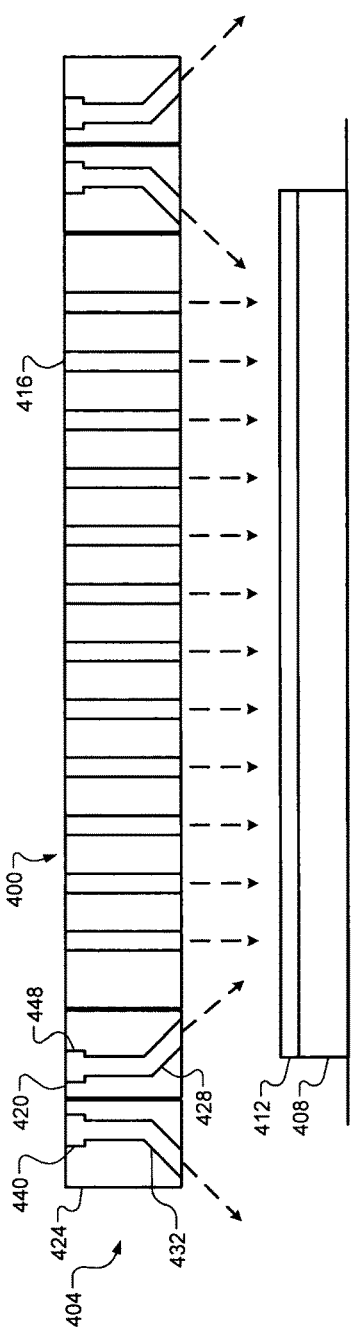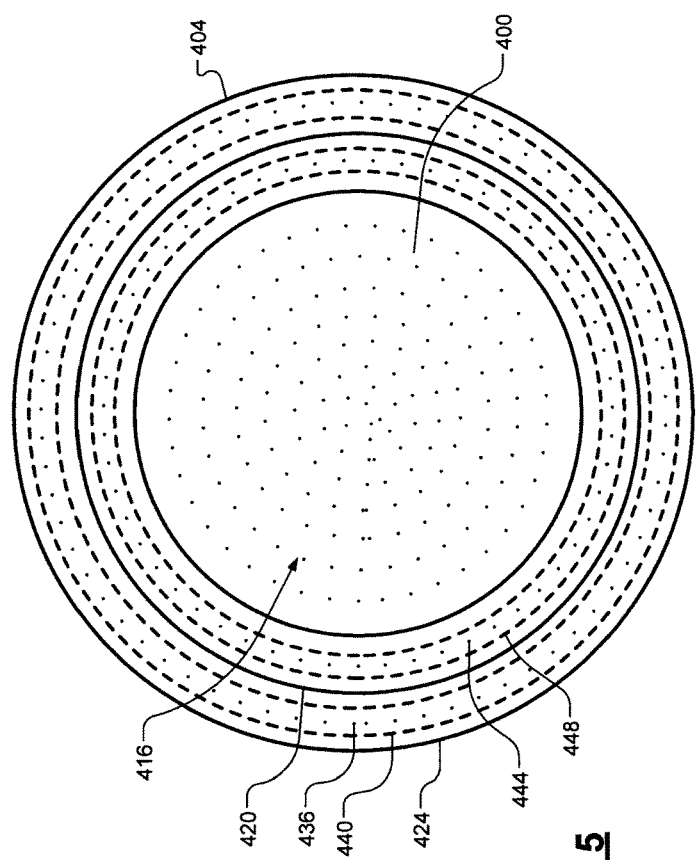

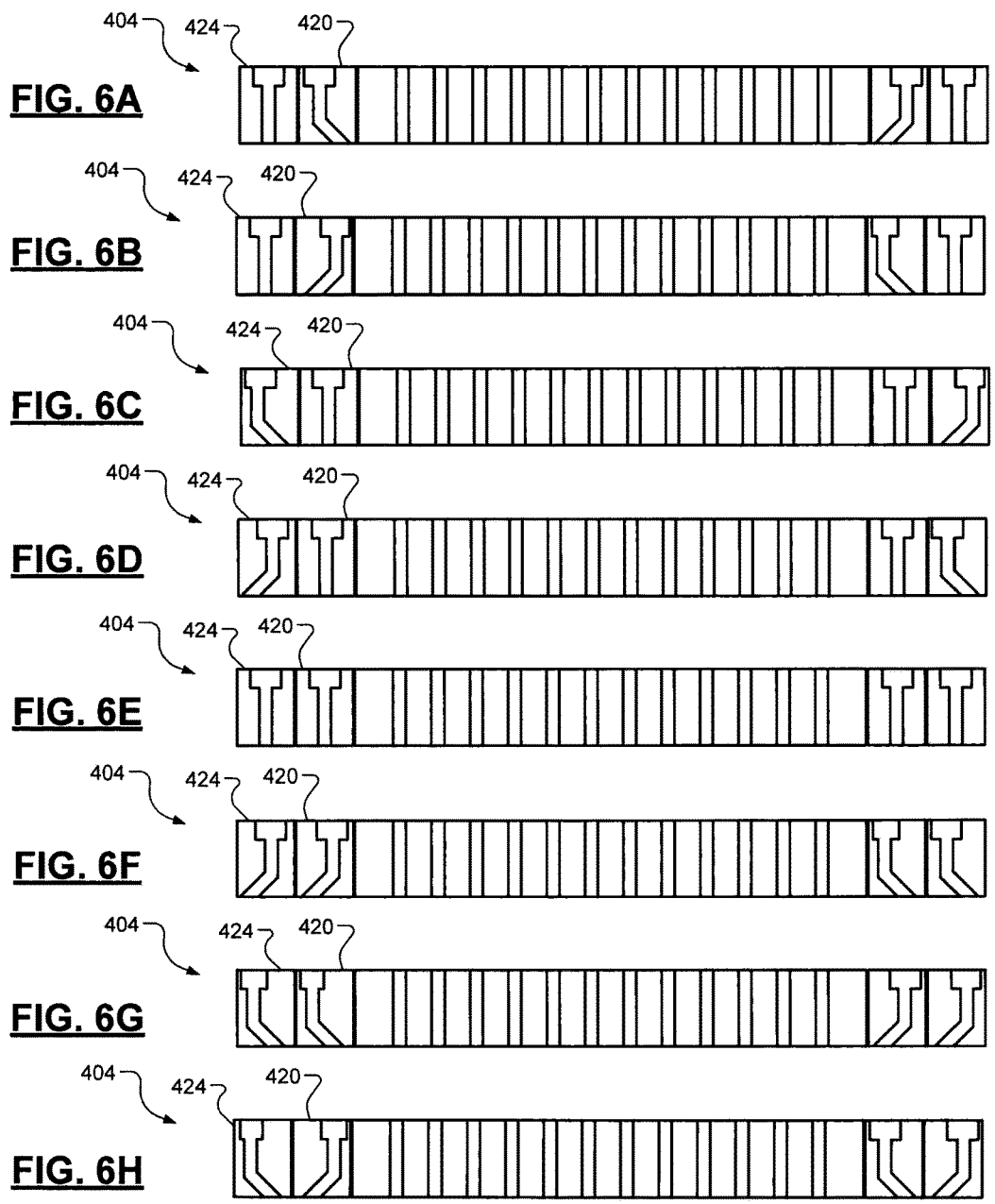

ADJUSTABLE SIDE GAS PLENUM FOR EDGE RATE CONTROL IN A DOWNSTREAM REACTOR

FIELD

The present disclosure relates to substrate processing, and more particularly to systems and methods for controlling distribution of process materials.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to etch film on a substrate such as a semiconductor wafer. The substrate processing system typically includes a processing chamber, a gas distribution device and a substrate support. During processing, the substrate is arranged on the substrate support. Different gas mixtures may be introduced into the processing chamber and radio frequency (RF) plasma may be used to activate chemical reactions.

The gas distribution device (e.g., a showerhead) is arranged above the substrate support with a fixed gap between the gas distribution device and the substrate. The gas distribution device distributes chemical reactants over the surface of the substrate during various process steps.

SUMMARY

A side tuning ring for a gas distribution device of a substrate processing system includes a first ring adjacent to a faceplate of the gas distribution device. The first ring surrounds the faceplate and defines a first plenum, communicates with a first gas source, and includes a first plurality of holes arranged to direct gas from the first gas source into a process chamber at a first angle. A second ring is adjacent to the first ring. The second ring surrounds the first ring and defines a second plenum, communicates with at least one of the first gas source and a second gas source, and includes a second plurality of holes arranged to direct gas from the at least one of the first gas source and the second gas source into the process chamber at the first angle or a second angle. The first ring and the second ring are detachable from the faceplate of the gas distribution device.

A method for operating for a gas distribution device of a substrate processing system includes providing a side tuning ring having a first ring adjacent to a faceplate of the gas distribution device and a second ring adjacent to the first ring. The first ring surrounds the faceplate and defines a first plenum and the second ring surrounds the first ring and defines a second plenum. The method further includes providing a first gas from a first gas source to the first plenum, using the first ring, directing the first gas from the first gas source into a process chamber at a first angle, providing at least one of the first gas from the first gas source and a second gas from a second gas source to the second plenum, and using the second ring, directing the at least one of the first gas and the second gas into the process chamber at the first angle or a second angle.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is an example faceplate of a gas distribution device;

FIGS. 3A and 3B illustrate example etch rates according to the present disclosure;

FIG. 4 is an example side tuning ring including an inner ring and an outer ring according to the present disclosure;

FIG. 5 is a top-down view of an example side tuning ring according to the present disclosure;

FIGS. 6A-6H illustrate example configurations of a side tuning ring according to the principles of the present disclosure.

In the drawings, reference numbers may be reused to identify similar and/or identical elements.

DETAILED DESCRIPTION

A gas distribution device such as a showerhead in a substrate processing system distributes chemical reactants (e.g., gases) over the surface of a substrate. The substrate is arranged on a substrate support below the gas distribution device. Typically, the gas distribution device includes a faceplate having a plurality of openings or holes for distributing the gases provided from above the faceplate. Gas distribution is affected by a variety of factors including, but not limited to, size and density of the openings, flow uniformity above the faceplate, the mixture of process gases being provided, flow of the gases (e.g., flow rates), etc.

Uniform distribution (i.e., flow) of gases over the substrate significantly affects the accuracy and efficiency of the process step being performed. Accordingly, substrate uniformity is dependent upon flow uniformity. Substrate uniformity is further affected by flow at an outer region, or edge, of the substrate. For example, the outer region of the substrate may only interact with process gases flowing from an outer edge of the faceplate. In some examples, the faceplate includes an outer region configured to direct process gases at the outer region of the substrate, which may be referred to as "side tuning" process gases.

Various features may be implemented to control the distribution of gases to improve flow uniformity and related processing. In some examples, faceplates may be interchangeable. For example, a faceplate having a desired hole pattern, hole size, etc. may be selected and installed for a particular process. However, changing the faceplate between processes and/or process steps may lead to loss of productivity, extended downtimes, increased maintenance and cleaning, etc.

Systems and methods according to the principles of the present disclosure provide an outer side-tuning ring including two or more rings and respective plenums arranged adjacent to the outer edge of the faceplate of the showerhead. The plenums of the side tuning ring may be configured to receive process gases from respective sources. The process gases may be the same or different, and the supply of the process gases may be the same or different. For example, a first process gas may be provided via a first outer ring and corresponding plenum (which may be referred to herein as an inner ring and/or inner plenum) at a first flow rate while a second process gas is provided via a second outer ring and corresponding plenum at a second flow rate, turned off, etc. Each of the rings may be configured to direct the respective process gases at the outer edge of the substrate at same or different angles. The outer rings may be arranged to be independently removed and replaced to achieve a desired side tuning configuration. In other words, the outer rings and plenums are not integral with the inner portion of the faceplate, and may be detachable from the faceplate and/or from each other.

Figure 1:
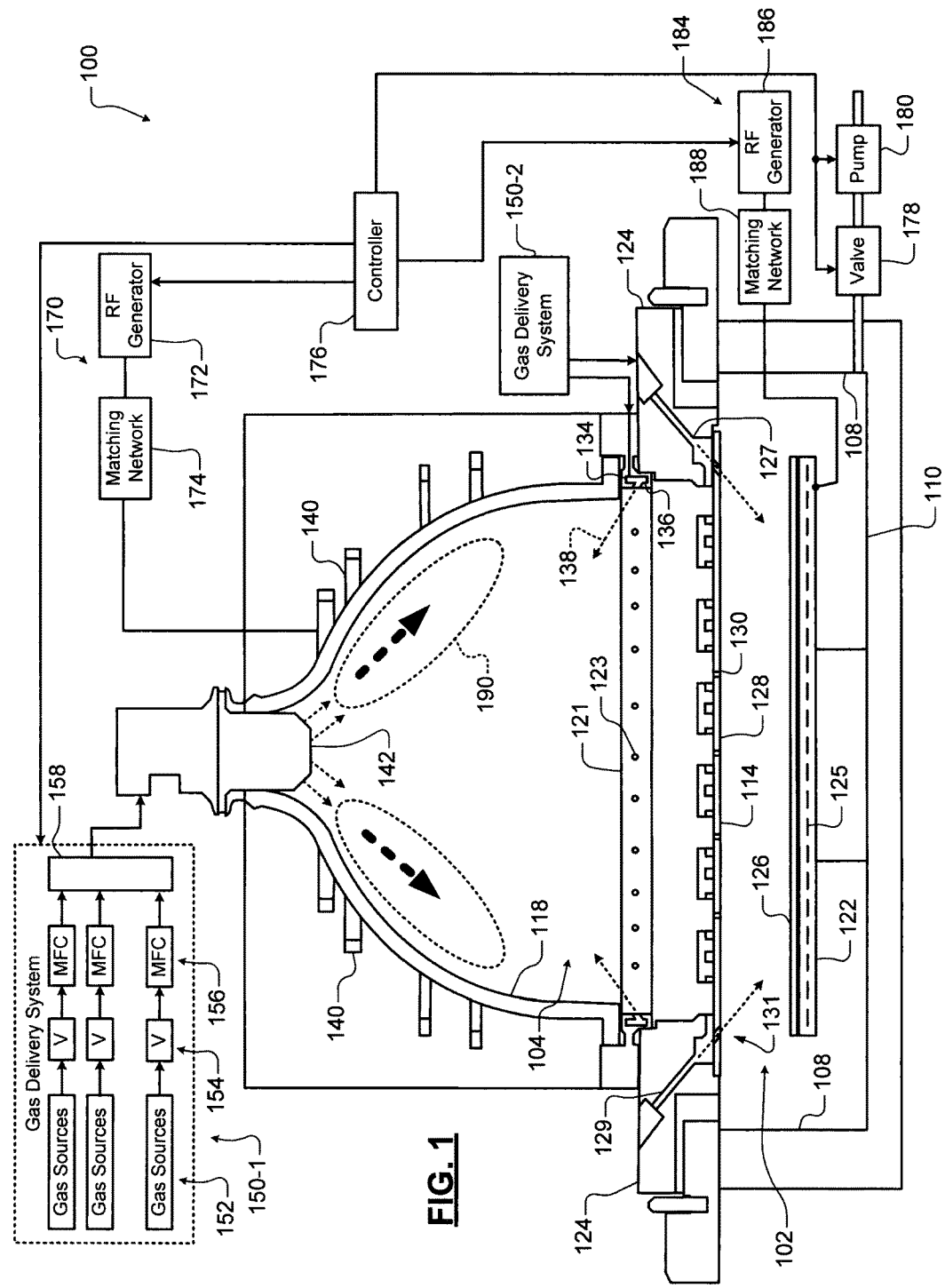
FIG. 1 is a functional block diagram of an example processing chamber.

Referring now to FIG. 1, an example of a substrate processing chamber 100 for etching a layer of a substrate is shown. In some examples, the layer includes tungsten (W). While a specific substrate processing chamber is shown and described, the methods described herein may be implemented on other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 124 that defines one or more spaced holes 127 for delivering side tuning process gas from a gas flow channel 129 to the lower chamber region 102. In some examples, holes 131 in the gas distribution device 114 align with the holes 127. In some examples, the process gas is delivered by the one or more spaced holes 127 in a downward direction towards the substrate at an acute angle relative to the plane including the gas distribution device 114, although other angles/directions may be used. In this manner, the holes 131 are arranged in the gas distribution device 114 to provide side tuning process gas to an outer region of the substrate 126.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 125, an optional cooling plate with fluid channels and one or more sensors (not shown); although any other suitable substrate support temperature control system may be used.

In some examples, the gas distribution device 114 includes a showerhead (for example, a faceplate 128 having a plurality of spaced holes 130 as well as the holes 131). The plurality of spaced holes 130 extend from the upper surface of the faceplate 128 to the lower surface of the faceplate 128. In some examples, the spaced holes 130 have a diameter in a range from 0.4" to 0.75" and the showerhead is made of a conducting material such as aluminum or a non-conductive material such as ceramic with an embedded electrode made of a conducting material. Accordingly, the faceplate 128 includes the plurality of spaced holes 130 arranged to provide process gas directly above the substrate 126 and the holes 131 arranged to provide side tuning process gas.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

Referring now to FIG. 2, an example faceplate 200 arranged above a substrate support 204 is shown. The faceplate 200 includes a top plate 208 and a bottom plate 212. The faceplate 200 includes a plurality of holes 216 in an inner region of the faceplate 200 to direct process gas directly downward toward a substrate 220 arranged on the substrate support 204. As used herein, "directly downward" may correspond to a vector parallel to a normal vector of the substrate 220. The faceplate 200 further includes a plurality of holes 224 arranged around a perimeter of the faceplate 200 to direct side tuning process gas at an outer region of the substrate 220.

Typically, the faceplate 200 includes separate plenums in the top plate 208 and/or the bottom plate 212. For example, the top plate 208 may include, as a first plenum, a circular groove or channel 228 for distributing process gas to the side tuning holes 224 in the bottom plate 212. Accordingly, the process gas is provided into the channel 228, which distributes the process gas via the holes 224. For example, the process gas may be provided into the channel 228 at a single injection point and then distributed throughout the channel 228 and then through the holes 224. Conversely, the top plate 208 may include, as a second plenum, a plurality of circular grooves or channels 232 (or, in some examples, a plurality of holes aligned with corresponding holes 216 in the bottom plate 212, or a single recessed region in the upper surface of the faceplate 200 that overlap all of the holes 216). Accordingly, the process gas is provided into the channels 232, which distribute the process gas via the holes 216.

Etch rate and etch uniformity may vary as distance from a center point of the substrate 220 increases. In FIGS. 3A and 3B, curves show etch rates 300 and 304 in an example polysilicon etch process. The etch rates 300 shown in FIG. 3A correspond to a process where a side tuning process gas (e.g., Argon, or Ar) was not provided. Conversely, the etch rates 304 shown in FIG. 3B correspond to a process where a side tuning process gas such as Argon was provided. In FIGS. 3A and 3B, the y axes indicate etch rate (ER) in Angstroms per minute (A/min) while the x axes indicate a radial distance (in mm) from a center of the substrate 220. The etch rates 300 and 304 each include a plurality of etch rates corresponding to a distance between an upper surface of the substrate and a bottom surface of the faceplate 200.

As shown, the overall etch rates 300 vary (e.g., generally decrease) from the center of the substrate 220 to an outer perimeter/edge of the substrate 220, and generally approach a minimum and an inflection point at approximately 140 mm from the center. The etch rates 300 then increase sharply at distances beyond 140 mm from the center of the substrate 220. Accordingly, not providing side tuning process gas results in a significant change in the etch rates 300 at outer edges of the substrate 220.

The overall etch rates 304 also vary from the center of the substrate 220 to the outer perimeter of the substrate 220. However, when the side tuning process gas is provided, the sharp increase in the etch rates 304 at the outer edges of the substrate 220 is eliminated.

Accordingly, providing side tuning process gas may vary etch rates at the outer edges of the substrate 220 depending on one or more factors including, but not limited to, type and flow rate of the side tuning process gas, configuration of the faceplate 200, arrangement and configuration of the side tuning plenums and holes, etc.

FIGS. 4 and 5 show an example faceplate 400 and side tuning ring 404 according to the principles of the present disclosure. FIG. 4 shows a cross-section view of the faceplate 400 and the side tuning ring 404 and FIG. 5 shows a top-down view of the faceplate 400 and the side tuning ring 404. The faceplate 400 is arranged above a substrate support 408. A substrate 412 may be arranged on the substrate support 408. The faceplate 400 includes a plurality of holes 416 arranged to direct process gas toward the substrate 412. For example, the holes 416 may be arranged to direct the process gas directly downward at the substrate 412. Conversely, the ring 404 may include a plurality (e.g., two or more) of rings including respective plenums, such as an inner ring 420 and an outer ring 424. As shown, the inner ring 420 and the outer ring 424 are independent of one another and are configured to be individually removed and replaced. In some examples, the inner ring 420 and the outer ring 424 are formed in a single removable ring. For example only, the side tuning ring 404 comprises aluminum and/or other suitable materials.

Each of the rings 420 and 424 includes a respective plurality of holes 428 and 432 arranged to direct process gas toward an outer edge of the substrate 412. As shown, the inner ring 420 directs process gas at a first angle inward toward the substrate 412 while the outer ring 424 directs process gas at a second angle outward. However, in other examples, the rings 420 and 424 may be configured to direct the process gas at same or different angles. Respective injection points for providing the process gas into the rings 420 and 424 are shown in FIG. 5. For example, the outer ring 424 may include m injection points 436 corresponding to an outer plenum 440 and the inner ring 420 may include n injection points 444 corresponding to an inner plenum 448. In some examples, m≠n, while in other examples m=n. While the plenums 440 and 448 are shown as U-shaped channels or grooves, other types of plenums may be implemented in the rings 420 and 424.

Accordingly, the rings 420 and 424 are configured to direct side tuning process gas at the substrate 412 at one, two, or more different angles. Further, each of the rings 420 and 424 may be connected to different respective process gas sources (e.g., Ar, $N_2$, etc.) that are independently controlled. For example, the controller 176 may control the gas sources (e.g., via gas delivery system 150-2) to selectively and individually adjust respective flow rates of the process gas provided by the inner ring 420 and the outer ring 424 based on a particular process step being performed, in response to user inputs, etc. In one example, the controller 176 automatically selects the flow rates for the respective rings 420 and 424 based on control data. For example, the control data may correspond to a table or index of flow rates for each of the rings 420 and 424 associated with various process gases, process steps, process temperatures, pedestal heights, substrate diameter and type, chamber characteristics, etc. In another example, the flow rates of the respective rings 420 and 424 may be independently adjusted according to user inputs (e.g., a user interface, control knobs, etc.).

FIGS. 6A through 6H illustrate some example configurations of the side tuning ring 404. In the examples, the inner ring 420 and the outer ring 424 are independently configured to direct side tuning process gas at the substrate 412 at different angles such as directly downward, inward, outward, etc. When angled inward or outward, the rings 420 and 424 may be configured to direct the side tuning gas at any angle greater than 0° (i.e., directly downward). For example, while shown at example angles of approximately 40°, in other examples the rings 420 and 424 may direct the side tuning process gas at any angle from 0° to approximately 80° inward or outward.

Figure 7A:
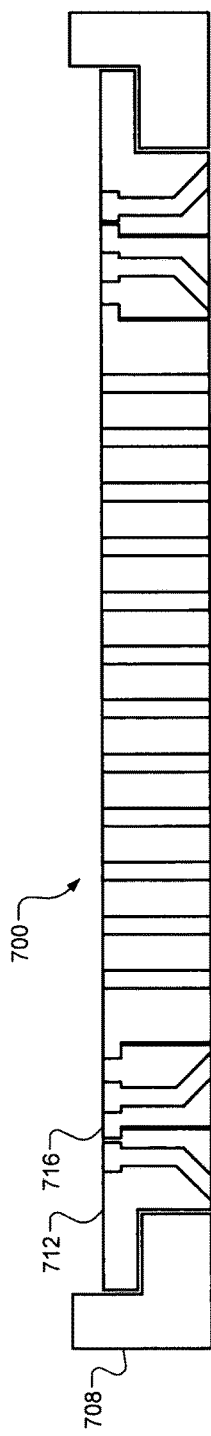
FIGS. 7A, 7B, and 7C illustrate example mounting configurations of the side tuning ring according to the principles of the present disclosure.
Figure 7B:
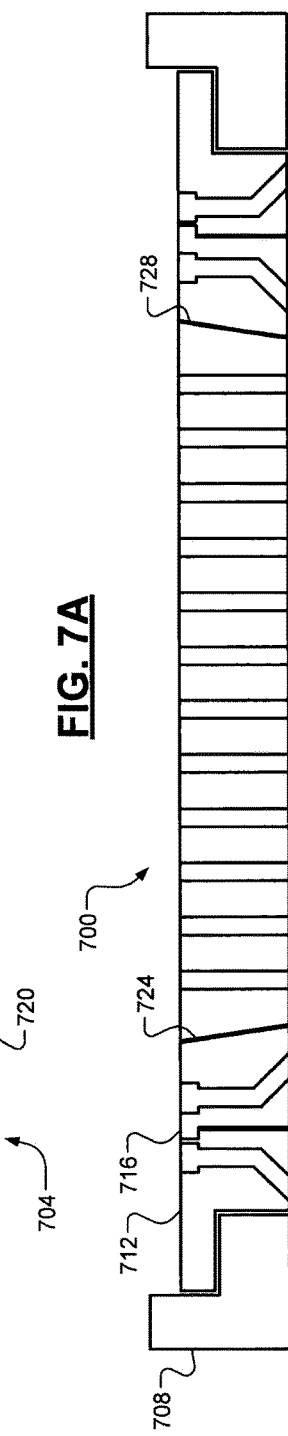
Figure 7C:
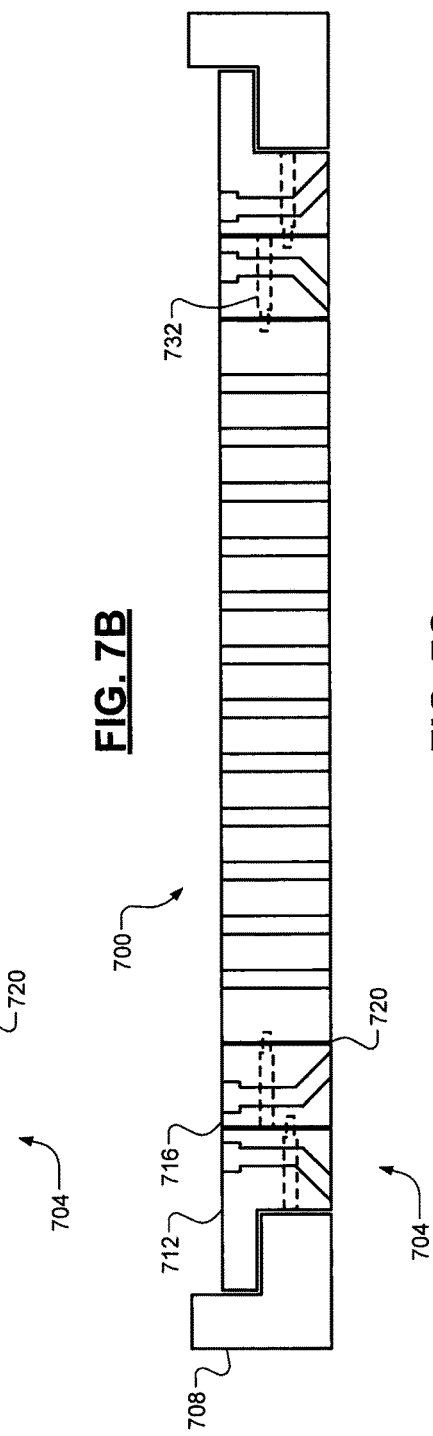

Referring now to FIGS. 7A, 7B, and 7C, example mounting configurations of a faceplate 700 and side tuning ring 704 are shown. In FIG. 7A, a process chamber may include an annular support 708 arranged to support the side tuning ring 704 (e.g., an outer ring 712 of the side tuning ring 704. The outer ring 712 in turn supports an inner ring 716 and the inner ring 716 supports the faceplate 700. Sealing members (e.g., comprised of one or more of Teflon, silicone, etc.) 720 may be provided between the annular support 708 and the outer ring 712, between the outer ring 712 and the inner ring 716, between the inner ring 716 and the faceplate 700, etc.

Conversely, as shown in FIG. 7B, one or more of the annular support 708, the outer ring 712, the inner ring 716, and the faceplate 700 may include an inner or outer sidewall having a tapered profile. For example only, as shown in FIG. 7B, the annular support 708 is arranged to support the outer ring 712 and the outer ring 712 in turn supports the inner ring 716. However, an inner diameter sidewall 724 of the inner ring 716 is tapered in a first direction while an outer diameter sidewall 728 of the faceplate 700 is tapered in a second direction.

Other suitable mounting configurations and/or combinations of the configurations described in FIGS. 7A through 7C may be implemented, including, but not limited to, annular supports, tapered sidewalls, screws, bolts, etc. For example, in one configuration, the annular support 708 supports the outer ring 712 while the inner ring 716 is attached to the outer ring 712 and/or the faceplate 700 using recessed bolts or screws 732.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A side tuning ring for a gas distribution device of a substrate processing system, the side tuning ring comprising:
a first ring adjacent to a faceplate of the gas distribution device, wherein
the first ring surrounds the faceplate and defines a first plenum, and
the first ring communicates with a first gas source and includes a first plurality of holes arranged to direct gas from the first gas source into a process chamber at a first angle; and
a second ring adjacent to the first ring, wherein
the second ring surrounds the first ring and defines a second plenum, and
the second ring communicates with at least one of the first gas source and a second gas source and includes a second plurality of holes arranged to direct gas from the at least one of the first gas source and the second gas source into the process chamber at a second angle,
wherein the first ring and the second ring are detachable from the faceplate of the gas distribution device,
wherein the first ring is detachable from the second ring, and
wherein the first angle and the second angle are different.

2. The side tuning ring of claim 1, wherein the first angle corresponds to one of inward with respect to the faceplate, outward with respect to the faceplate, and directly downward from the first ring, and wherein the second angle corresponds to another one of inward with respect to the faceplate, outward with respect to the faceplate, and directly downward from the second ring.

3. The side tuning ring of claim 1, wherein at least one of the first ring and the second ring is arranged above an outer edge of a substrate in the process chamber.

4. A system comprising the side tuning ring of claim 1, and further comprising:
the first gas source;
the second gas source; and
a controller.

5. The system of claim 4, wherein the first gas source includes a first gas and the second gas source includes a second gas different from the first gas.

6. The system of claim 4, wherein the controller independently controls first gas flow from the first gas source through the first ring and second gas flow from the second gas source through the second ring.

7. The system of claim 6, wherein the first gas flow is provided to a first plurality of injection points in a top side of the first ring and the second gas flow is provided to a second plurality of injection points in a top side of the second ring.

* * * * *